United States Patent
Lai

(10) Patent No.: US 6,362,876 B1
(45) Date of Patent: Mar. 26, 2002

(54) LASER BEAM POWER DETECTING DEVICE FOR PLANAR TYPE SEMICONDUCTOR LASER DIODE

(76) Inventor: Shian-Fu Lai, 5F, #737-2, Shing Fure Road, Shin Juang City, Tapei (TW)

( * ) Notice: Subject to any disclaimer, the term of this patent is extended or adjusted under 35 U.S.C. 154(b) by 0 days.

(21) Appl. No.: 09/598,261

(22) Filed: Jun. 21, 2000

(51) Int. Cl.⁷ .................................................. G01J 1/42
(52) U.S. Cl. ..................................................... 356/218
(58) Field of Search ................................ 356/213, 218, 356/219, 220, 227; 372/7, 34, 35, 36, 43, 44; 385/15, 39, 129–131

(56) References Cited

U.S. PATENT DOCUMENTS

| | | | |
|---|---|---|---|
| 4,945,391 A | * 7/1990 | Yagoura et al. | 357/19 |
| 5,265,113 A | * 11/1993 | Halldorsson et al. | 372/36 |
| 5,309,460 A | * 5/1994 | Fujimaki et al. | 372/36 |
| 5,327,443 A | * 7/1994 | Tanaka et al. | 372/36 |
| 5,577,142 A | * 11/1996 | Mueller-Fiedler et al. | 385/47 |
| 5,793,785 A | * 8/1998 | Nakanish et al. | 372/36 |
| 5,907,571 A | * 5/1999 | Ogino et al. | 372/43 |

* cited by examiner

Primary Examiner—Frank G. Font
Assistant Examiner—Michael P. Stafira
(74) Attorney, Agent, or Firm—Troxell Law Office PLLC

(57) ABSTRACT

A laser beam power detecting device for planar type semiconductor laser diode is disclosed. The laser beam power detecting device includes a heat dissipation substrate mounted on a printed circuit board, and a laser diode mounted on the heat dissipation substrate. The laser diode is capable of emitting a first laser beam toward a front end thereof and a second laser beam toward a rear end thereof. A light reflecting plate is mounted on the printed circuit board and at a rear area of the heat dissipation substrate for reflecting the second laser beam emitted from the laser diode. A light detecting diode is arranged between the laser diode and the light reflecting plate for receiving the reflected laser beam reflected by the light reflecting plate, thereby detecting an output power of the first laser beam emitted by the laser beam and then controlling the driving current of the laser diode under control of a control circuit.

2 Claims, 6 Drawing Sheets

LASER BEAM POWER DETECTING DEVICE FOR PLANAR TYPE SEMICONDUCTOR LASER DIODE

BACKGROUND OF THE INVENTION

1. Field of the Invention

The present invention generally relates to a laser beam power detecting device, and in particular to a laser beam power detecting device for a planar type semiconductor laser diode.

2. Description of the Prior Art

In recent years, the technology of semiconductor advances rapidly accompanying with great progress of the electronic components. The semiconductor laser diode is wildly used in various applications.

With reference to FIG. 1, it shows a perspective view of a prior art semiconductor laser diode. The laser diode is provided with a substrate 18, a first carrier guiding layer 17a, a second carrier guiding layer 17b, and a laser beam emitting section 16. The laser beam emitting section 16 is interposed between the first carrier guiding layer 17a and the second carrier guiding layer 17b, capable of emitting laser beams toward both front and rear ends. For detecting the laser beam power of the laser diode, a light detecting element, such as a light detecting diode, can be used to detect the intensity of the laser power transmitted from the rear end of the laser diode.

However, it is noted that the conventional laser beam power detecting device can not effectively detect the intensity of the laser power of the laser diode, therefore the effect of automatic power controlling is not good. Besides, the output power of the laser diode will be unstable because of affecting of the environment temperature and the heat dissipated by the laser diode during operation.

For stabilizing the output power, the heat of the laser diode must be dissipated by a base, and a light detecting diode is required to detect the laser beam power.

FIG. 2 is a partially cross-sectional view showing a conventional laser beam power detecting device for detecting the laser beam power of a laser diode being assembled in a metal can 14. A window area 15 made of glass material is mounted on a top of the metal can 14. A laser diode 20 is supported on a base and the laser beam transmitted by the laser diode 20 may be emitted out through the window area 15. A light detecting diode 13 is arranged exactly under the laser diode 20 for detecting the intensity of the output power of the laser diode 20.

The light signal received by the light detecting diode 13 will be converted to electric signal and then detected by a control circuit. According to the intensity of the electric signal, the driving current of the laser diode 20 will be adjusted to a suitable value, thereby achieving automatic power controlling. However, this conventional technique is not suitable to be applied in planar type semiconductor laser diode.

It is thus desirable to have a laser beam power detecting device for planar type semiconductor laser diode for overcoming the problems discussed above.

SUMMARY OF THE INVENTION

Accordingly, the primary object of the present invention is to provide a laser beam power detecting device particularly designed to be suitable for planar type semiconductor laser diode.

The other object of the present invention is to provide a laser beam power detecting device having better light power detecting effect for the planar type semiconductor laser diode.

To achieve the above objects, in accordance with the present invention, there is provided a laser beam power detecting device comprising a heat dissipation substrate mounted on a printed circuit board, and a laser diode mounted on the heat dissipation substrate. The laser diode is capable of emitting a first laser beam toward a front end thereof and a second laser beam toward a rear end thereof. A light reflecting plate is mounted on the printed circuit board and at a rear area of the heat dissipation substrate for reflecting the second laser beam emitted from the laser diode. A light detecting diode is arranged between the laser diode and the light reflecting plate for receiving the reflected laser beam reflected by the light reflecting plate, thereby detecting an output power of the first laser beam emitted by the laser beam and then controlling the driving current of the laser diode under control of a control circuit. The light reflecting plate is mounted on the printed circuit board at a vertical manner. Alternatively, the light reflecting plate is mounted on the printed circuit board at an inclined angle.

Preferably, the light reflecting plate further comprises two enclosing side plates formed at two side ends of the light reflecting plate. The light reflecting plate may be in a form of protective light reflecting frame comprising a rear reflecting plate having two side ends, two side protecting plates formed at two side ends of the rear reflecting plate, and a top plate forming a protective frame for protecting the laser diode and the light detecting diode.

BRIEF DESCRIPTION OF THE DRAWINGS

The present invention will be apparent to those skilled in the art by reading the following description of preferred embodiments thereof, with reference to the accompanying drawings, in which.

DETAILED DESCRIPTION OF THE PREFERRED EMBODIMENTS

Figure 1:
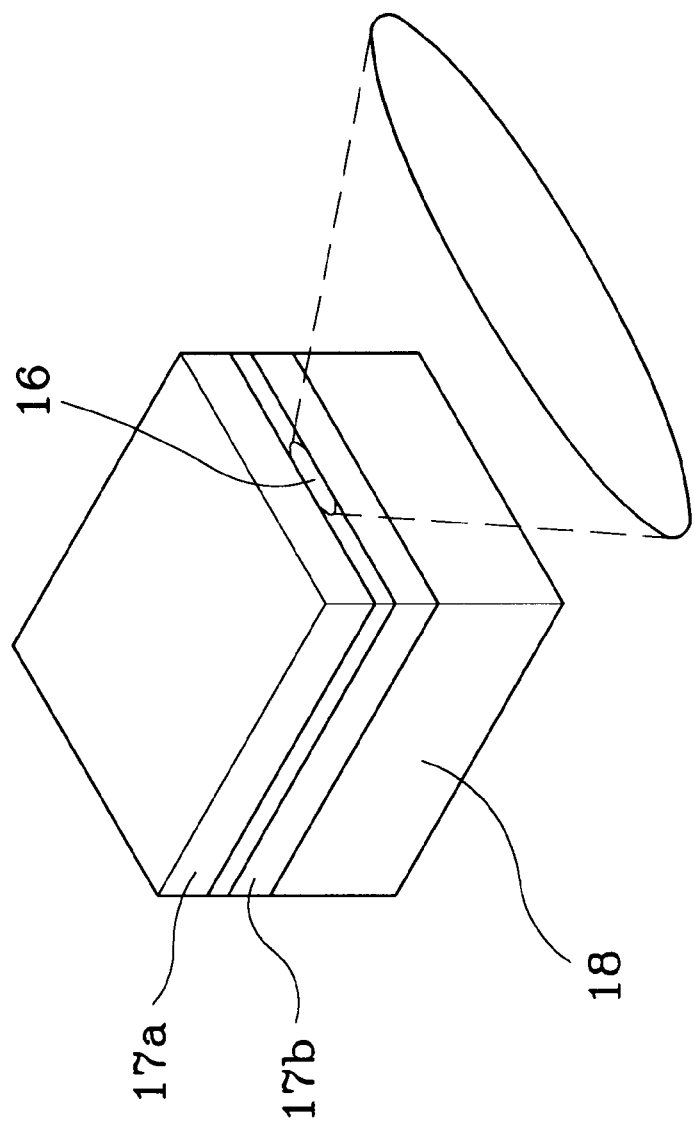
FIG. 1 is a perspective view showing a basic structure of a prior art laser diode.
Figure 2:
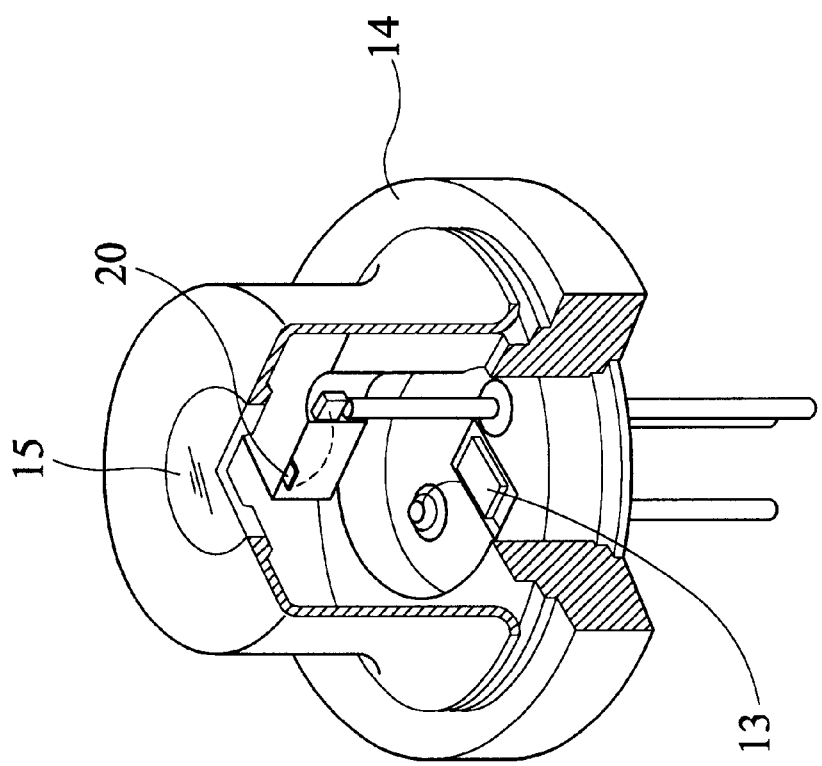
FIG. 2 is a partially cross-sectional view showing a conventional laser assembly incorporating with a laser beam power detecting device being assembled in a metal can.
Figure 3:
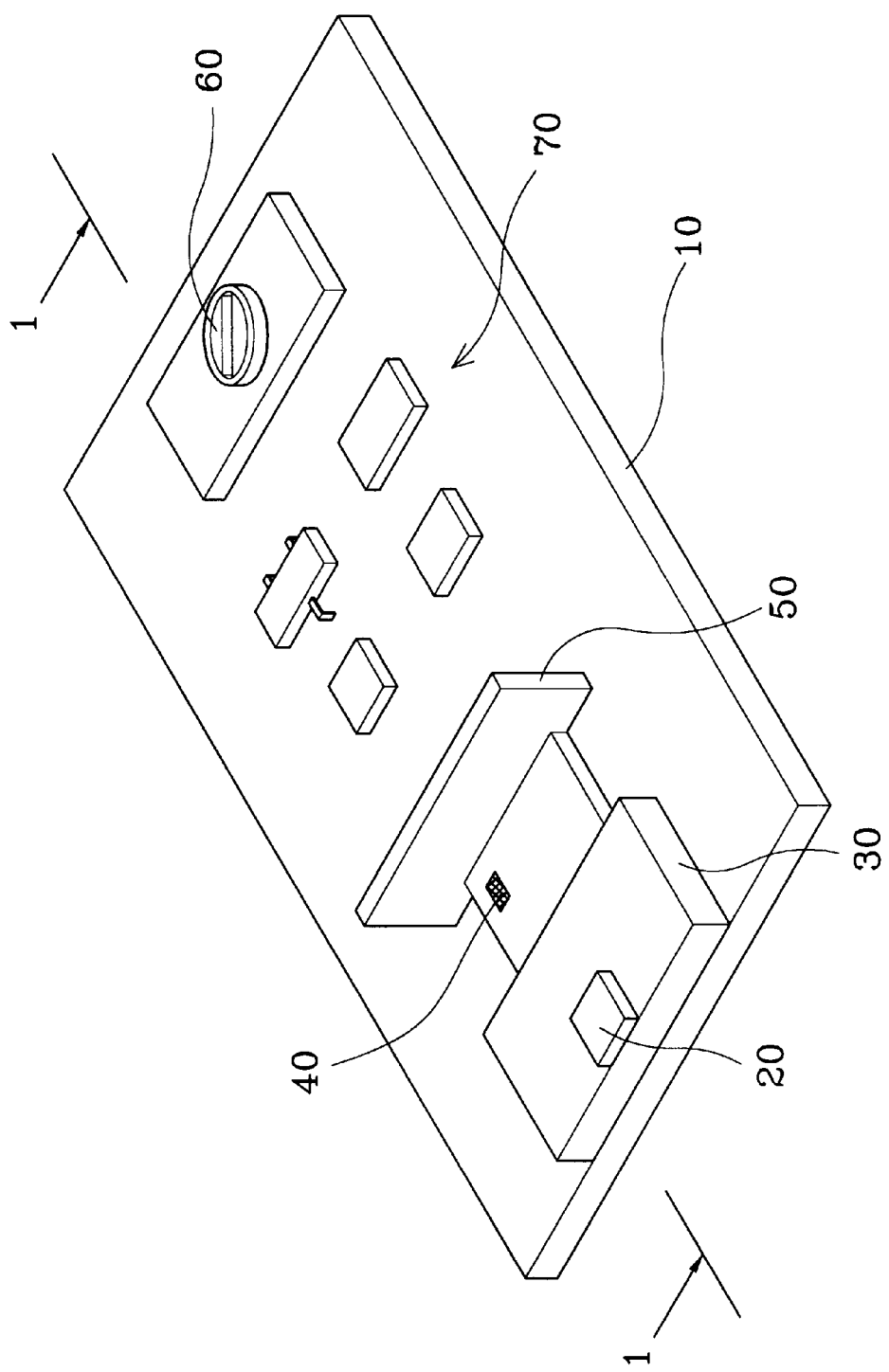
FIG. 3 is a perspective view of a laser beam power detecting device for planar type semiconductor laser diode in accordance with a first embodiment of the present invention.
Figure 4:
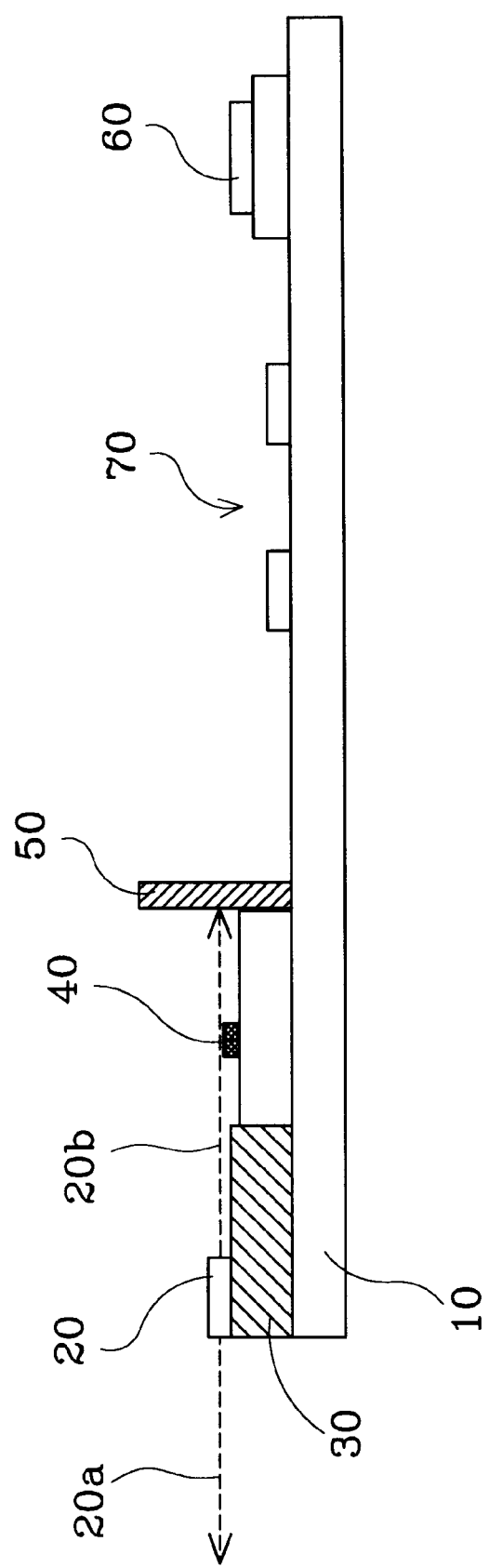
FIG. 4 is a cross-sectional view taken along line 1—1 of FIG. 3.

With reference to the drawings, in particularly to FIGS. 3 and 4, according to the first embodiment of the present invention, the laser beam power detecting device for planar type semiconductor laser diode comprises a heat dissipation substrate 30 mounted on a printed circuit board 10. A laser diode 20 is arranged on the heat dissipation substrate 30, capable of emitting a first laser beam 20a toward the front end thereof and a second laser beam 20b toward the rear end thereof. The heat generated by the laser diode 20 may be dissipated by the heat dissipation substrate 30.

A light detecting diode 40 is arranged on the printed circuit board 10 and the rear of the heat dissipation substrate 30 for detecting the intensity of the second laser beam 20b emitted by the laser diode 20. A light reflecting plate 50 is further arranged at the rear of the light detecting diode 40 for reflecting the second laser beam 20b emitting from the backside of the laser diode 20 to the light detecting diode 40, so that the laser beam power of the laser diode 20 may be detected by the light detecting diode 40.

A control circuit comprising a variable resistor 60 and a plurality of electronic components 70 are arranged on the printed circuit board 10, adapted to control the driving current of the laser diode 20.

The light signal received by the light detecting diode 40 will be converted into electric signals under control of the control circuit arranged on the printed circuit board 10. So, the driving current of the laser diode may be adjusted, thereby stabilizing the output power of the laser beam and controlling the power automatically.

In a preferred embodiment of the present invention, the light reflecting plate 50 is mounted on the printed circuit board 10 in a vertical manner. Alternatively, for coordinating the light receiving angle of the light detecting diode 40, the light reflecting plate 50 may be mounted on the printed circuit board 10 at a predetermined inclined angle to make the light detecting diode 40 partially receiving the reflected light of the second laser beam 20b.

Figure 5:
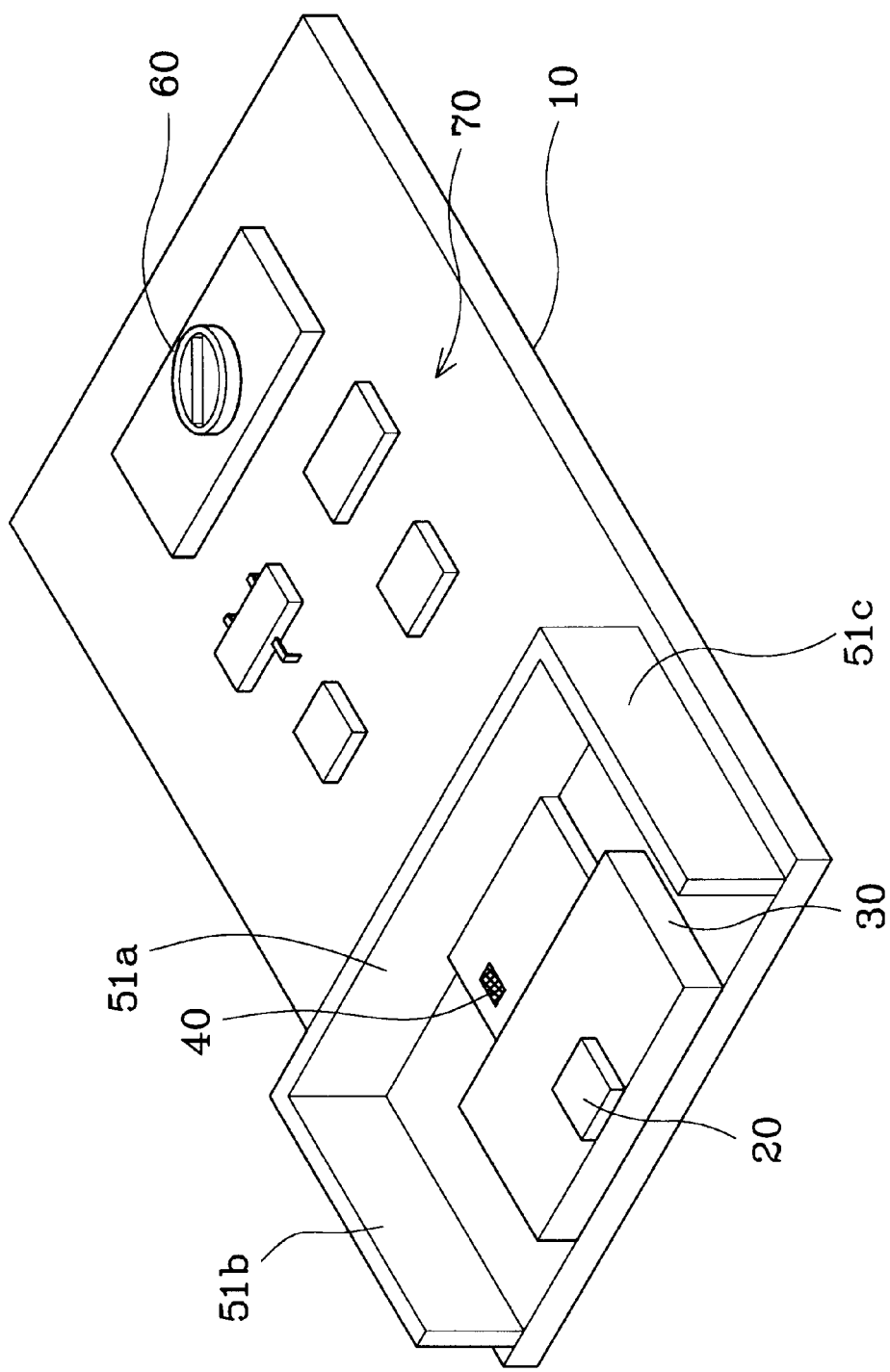
FIG. 5 is a perspective view of a laser beam power detecting device in accordance with a second embodiment of the present invention.

FIG. 5 is a perspective view in accordance with the second embodiment of the present invention. The light reflecting plate 50 in the first embodiment is replaced by an enclosing light reflecting plate comprising a rear light reflecting plate 51a and two enclosing side plates 51b and 51c respectively formed at side end of the rear light reflecting plate 51a. The rear light reflecting plate 51a serves as a light reflecting plane for reflecting the second laser beam emitted from the laser diode 20, and the two side extended side plates serves as protective plates for preventing the laser diode 20 and the light detecting diode 40 from being damaged by an external force.

Figure 6:
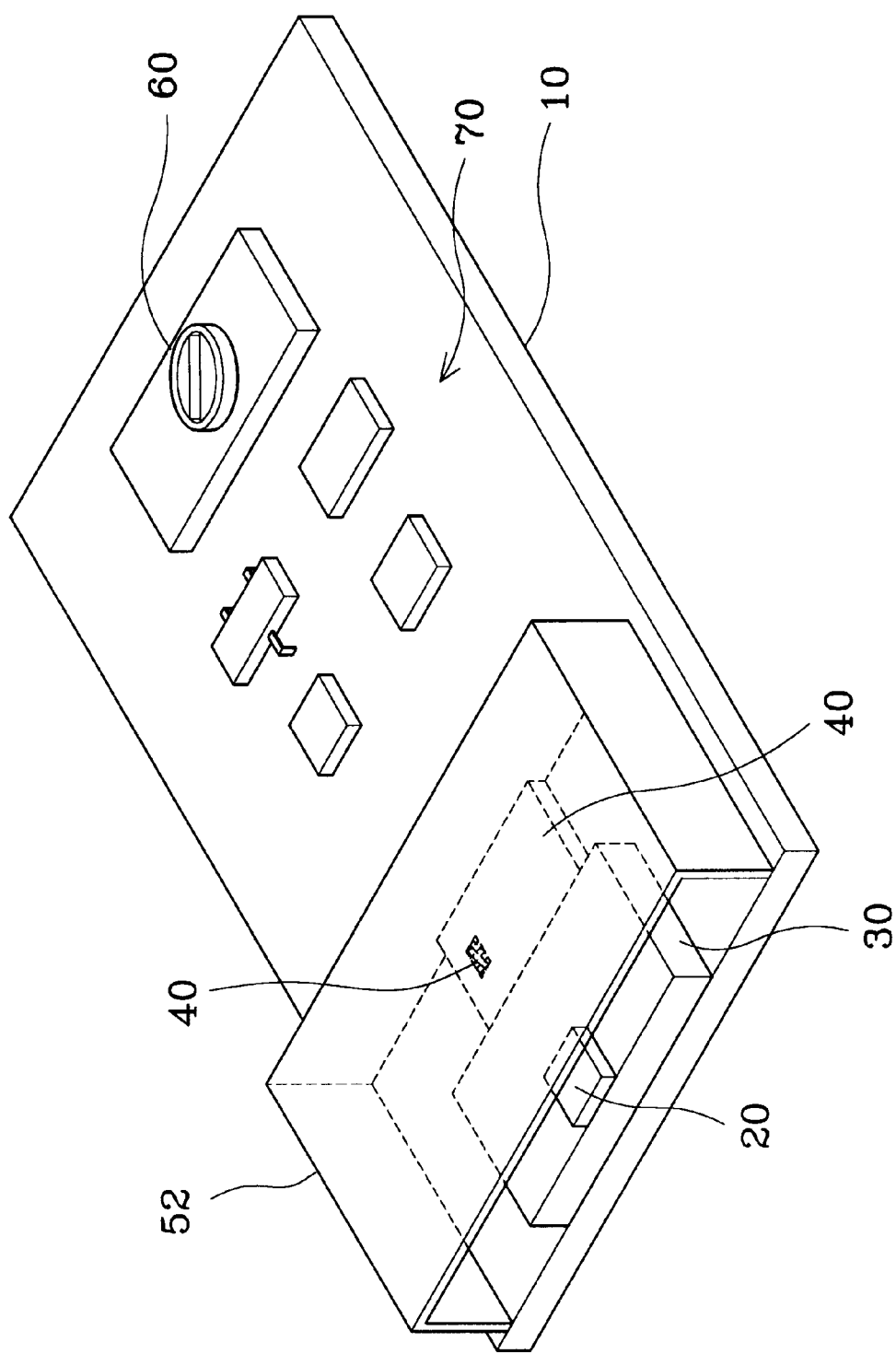
FIG. 6 is a perspective view of a laser beam power detecting device in accordance with a third embodiment of the present invention.

FIG. 6 is a perspective view shows the third embodiment of the present invention. The enclosing light reflecting plate 51 in the second embodiment is further replaced by a protective light reflecting frame 52. The protective light reflecting frame 52 comprises a rear reflecting plate, two side protecting plates and a top plate, forming a protective frame. The protective light reflecting frame 52 may not only effectively reflect the laser beam emitting from the laser diode 20, but also protect the laser diode 20 and the light detecting diode 40.

Although the present invention has been described with respect to the preferred embodiments, it is contemplated that a variety of modifications, variations and substitutions may be done without departing from the scope of the present invention that is intended to be defined by the appended claims.

I claim:

1. A laser beam power detecting device for a planar type semiconductor laser d iode, comprising:

a planar printed circuit board;

a heat dissipation substrate mounted on the printed circuit board; a laser diode mounted on the heat dissipation substrate, emitting a first laser beam and a second laser beam:

a light reflecting plate mounted on the printed circuit board and extending at a right angle to the plane of the circuit board, the light reflecting panel located at a rear area of the heat dissipation substrate to reflect the second laser beam emitted from the laser diode; and, a light detecting diode located at a middle section between the laser diode and the light reflecting plate and receiving the reflected laser beam reflected by the light reflecting plate, thereby detecting an output power of the first laser beam emitted by the laser beam.

2. The laser beam power detecting device of claim 1 wherein the light reflecting plate has two opposite ends and further comprising:

a) a side protecting plate extending from each of the opposite ends of the light reflecting plate, each oriented at a right angle with respect to the printed circuit board; and, b) a top plate mounted on the light reflecting plate and the two side protecting plates so as to extend over the laser diode and the light detecting diode.

* * * * *